United States Patent [19]
Matsuoka

[11] Patent Number: 5,018,168
[45] Date of Patent: May 21, 1991

[54] CLOCK SIGNAL CONVERSION CIRCUIT
[75] Inventor: Takeru Matsuoka, Kawasaki, Japan
[73] Assignee: Fujitsu Limited, Kanagawa, Japan
[21] Appl. No.: 477,540
[22] Filed: Feb. 9, 1990
[30] Foreign Application Priority Data
  Feb. 9, 1989 [JP] Japan .................................. 1-30433
[51] Int. Cl.$^5$ ............................................. H04L 7/00
[52] U.S. Cl. .................................. 375/106; 307/269;
  307/470; 375/119
[58] Field of Search ............... 375/106, 108, 111, 117,
  375/119; 370/49; 328/63, 72, 99, 155; 307/269,
  262, 239, 470, 479

[56] References Cited
U.S. PATENT DOCUMENTS

| | | | |
|---|---|---|---|
| 4,308,472 | 12/1981 | McLaughlin | 375/108 |
| 4,636,656 | 1/1987 | Snowden et al. | 307/470 |
| 4,644,568 | 2/1987 | Canniff et al. | 375/108 |
| 4,780,890 | 10/1988 | Kane | 375/106 |

Primary Examiner—Benedict V. Safourek
Attorney, Agent, or Firm—Staas & Halsey

[57] ABSTRACT

A clock signal conversion circuit receives a clock signal and a control signal and generates a converted clock signal. A flip-flop holds the control signal in response to the clock signal and outputs a held control signal. The clock signal is selectively masked by an or gate in response to the held control signal thereby outputting the converted clock signal. A set signal is generated by a NAND gate in response to the clock signal, the control signal and the held control signal. The flip-flop forces the control signal to a predetermined state in response to the set signal generated by the NAND gate.

7 Claims, 5 Drawing Sheets

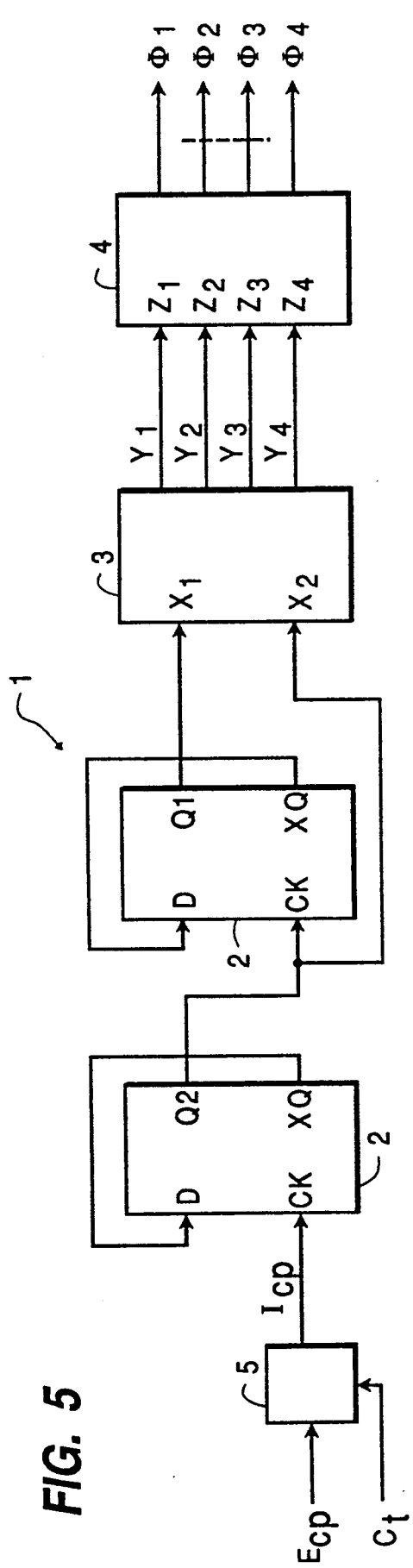
FIG. 5
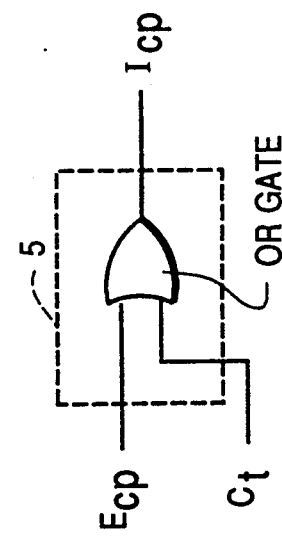
FIG. 6 *PRIOR ART*

CLOCK SIGNAL CONVERSION CIRCUIT

FIELD OF THE INVENTION

The present invention relates in general to a clock signal conversion circuit, and in particular to a clock signal conversion circuit that converts an external clock signal to an internal clock signal having a desired frequency.

In general, in a digital system, each of the system assemblies is timed with the aid of a clock signal. Since such a clock signal is common to the system, for example, when clock signals of different frequencies are required, different internal clock signals are produced from the common clock signal for each system assembly. For this purpose, a clock signal conversion circuit is employed.

DESCRIPTION OF THE PRIOR ART

FIG. 5 illustrates a pulse motor controller 1 in which a conventional clock signal conversion circuit is employed. The pulse motor controller 1 includes asynchronous counters 2, a decoder 3, a drive current output circuit 4 and a clock signal conversion circuit 5. The frequency of an external clock signal Ecp is varied according to a control signal Ct to produce an internal clock signal Icp. The internal clock signal Icp is inputted to the asynchronous counters 2, and according to the logic of the terminals Q1 and Q2 of the counters 2, the decoder 3 outputs signals Y1, Y2, Y3 and Y4. In response to these signals Y1, Y2, Y3 and Y4, the drive current output circuit 4 produces polyphase power pulses $\Phi1$, $\Phi2$, $\Phi3$ and $\Phi4$, which pulses are then supplied to the exciting coils of a pulse or stepping motor (not shown).

The above described clock signal conversion circuit 5 is constituted by an OR gate, as shown in FIG. 6. The internal clock signal Icp outputted from the OR gate becomes Icp="H" while the control signal Ct is in "H" level, and becomes Ecp=Icp while the control signal Ct is in "L" level. That is to say, as shown in FIG. 7A, by suitably setting the period of "L" level of the control signal Ct and the cycle of the Ct, the internal clock signal Icp can be produced which synchronizes with the external clock signal Ecp and has a requisite frequency.

The above described conventional clock signal conversion circuit 5 is constructed such that the internal clock signal Icp is produced by the OR logic between the external clock signal Ecp and the control signal Ct. Therefore, if, as shown in FIG. 7(b), changes in the control signal Ct (for example, asynchronous pulses (a) and (b)) have occurred in the period of Ecp="L", there was the problem that the pulses (a) and (b) appeared in the internal clock signal Icp and caused errors in subsequent circuits using the internal clock signal Icp. This is a problem that can be expected when the cycle of the external clock signal Ecp is long and so the "L" level period is long. In addition, since the above described asynchronous pulses tend to be generated by external noises such as power source noises, the influence of the problem described above is large. Therefore, when the conventional clock signal conversion circuit is used, it is required not to make the "L" level period of the external clock signal Ecp long. Consequently, the conventional clock signal conversion circuit is difficult to use.

Accordingly, it is an object of the present invention to provide an improved clock signal conversion circuit which overcomes the problems associated with the conventional conversion circuit and is easy to use.

SUMMARY OF THE INVENTION

In order to achieve the above object, as shown in FIG. 1, there is provided, in accordance with the present invention, a clock signal conversion circuit which receives an external clock signal and a control signal and generates a converted (internal) clock signal, the clock signal conversion circuit comprises holding means for holding the control signal in response to the clock signal masking and outputting a held control signal; means for selectively masking the clock signal in response to the held control signal and outputting the converted clock signal; and generating (set) means or generating a set signal in response to the clock signal, the control signal and the held control signal, the holding means being forced a predetermined state in response to the set signal. The holding means may comprise a D-type flip-flop. The D-type flip-flop may also comprise a flip-flop circuit having a data input terminal for receiving the control signal, a clock input terminal for receiving the clock signal, an output terminal for outputting the held control signal, an inverted output terminal for outputting an inverted held control signal, and a set terminal for receiving the set signal. The masking means may also comprise an OR-gate for receiving the clock signal and the held control signal and outputting the converted clock signal. The generating means may also comprise a NAND gate for receiving the clock signal, the control signal and the inverted held control signal and outputting the set signal to the set terminal of the flip-flop. A period of the clock signal may also be smaller than that of the control signal. The control signal may also be asynchronous with the control signal.

In accordance with the present invention, the electric potential state of the control signal when the external clock signal is in "L" level is not maintained in the flip-flop. Therefore, even if the control signal changed when the external clock signal is in "L" level, this change would not appear in the internal clock signal. Thus, the problem associated with the conventional clock signal conversion circuit can be avoided by the present invention.

BRIEF DESCRIPTION OF THE DRAWINGS

The above and other objects and advantages will become apparent from the following detailed description when read in conjunction with the accompanying drawings wherein:

FIG. 5 is a block diagram of a pulse motor controller in which a conventional clock signal conversion circuit is employed;

FIG. 6 shows the structure of the conventional clock signal conversion circuit.

DESCRIPTION OF A PREFERRED EMBODIMENT

Figure 1:
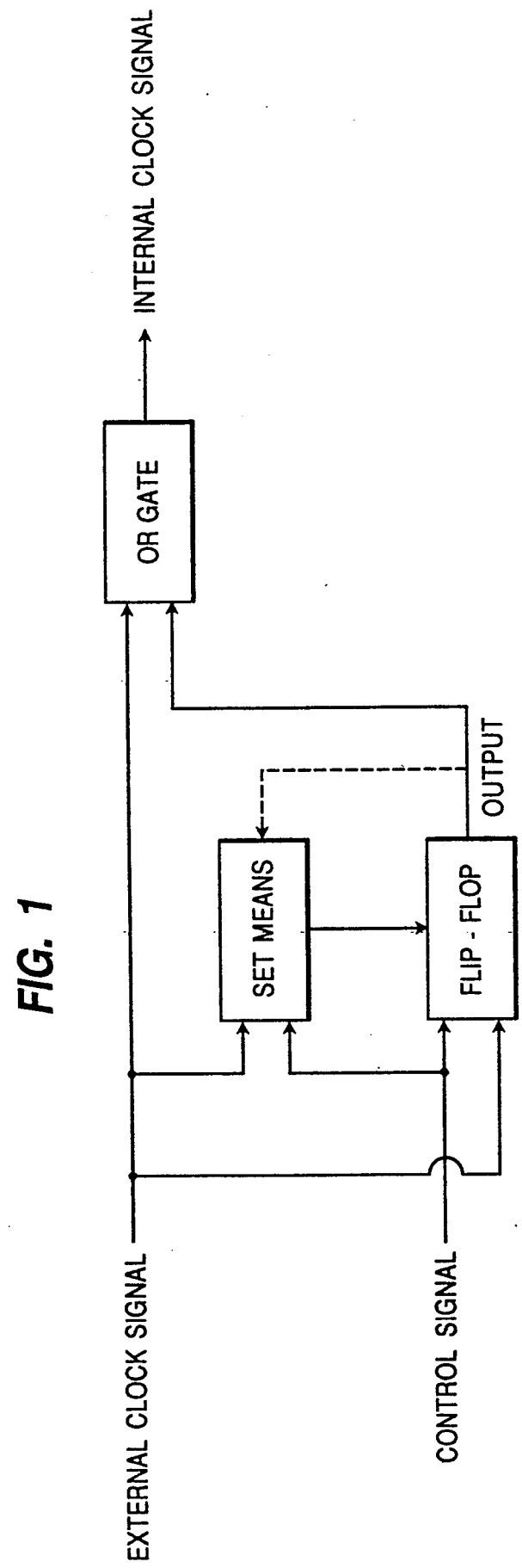
FIG. 1 is a block diagram of the principle of the present invention.
Figure 2:
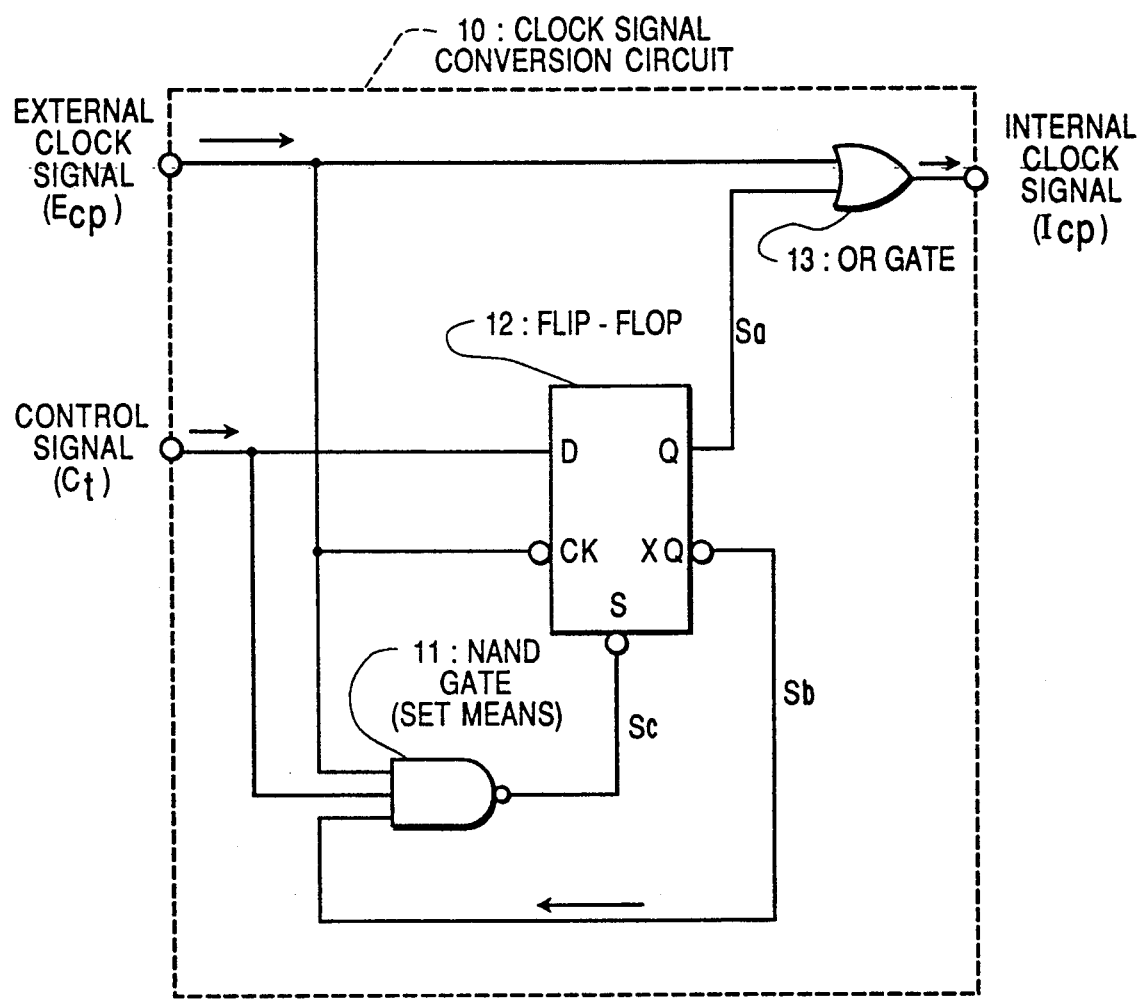
FIG. 2 shows the structure of a clock signal conversion circuit according to the present invention.

Referring to FIG. 2, there is shown a preferred embodiment of a clock signal conversion circuit 10 in accordance with the present invention. The clock signal conversion circuit 10 comprises a NAND gate 11, a flip-flop 12 with a forced set input S, and an OR gate 13. The NAND gate 11 is constructed such that it outputs a forced set signal Sc of "L" level, when an external clock signal Ecp and a control signal Ct are both in a first electric potential, for example, "H" level and when an output signal Sb from the flip-flop 12 is in a level representing a reset state, for example, "H" level. The NAND gate 11 therefore functions as set means. If the forced set signal Sc from the NAND gate 11 is inputted with "L" level to the flip-flop 12, the flip-flop 12 then shifts to a set state in which the electric potential state of the forced set signal Sc at that time is maintained. In addition, if, after the shift to the set state, the control signal Ct is in a second electric potential, for example, "L" level, and the external clock signal Ecp falls from "H" level to "L" level, then the flip-flop 12 shifts to a reset state. In the set state, the flip-flop 12 outputs signals Sa (Sa="H") and Sb (Sb="L") from output terminals Q and XQ, respectively, and in the reset state, the flip-flop 12 outputs signals Sa (Sa="L") and Sb (Sb="H"). The OR gate 13 outputs an internal clock signal Icp in accordance with the OR logic between the output signal Sa from the flip-flop 12 and the external clock signal Ecp. For instance, the internal clock signal Icp is maintained "H" when Sa="H" and becomes Ecp=Icp when Sa="L".

Figure 4:
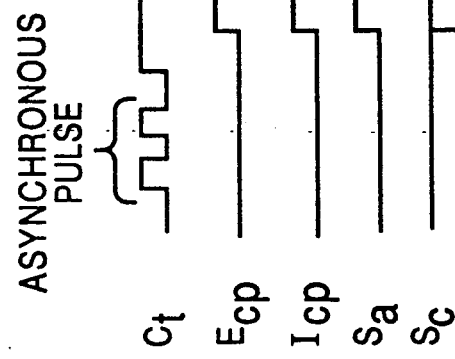
FIG. 4 is a timing diagram illustrating how the clock signal conversion circuit is operated when the cycle of the control signal Ct is shorter than that of the external clock signal Ecp.
Figure 7A:
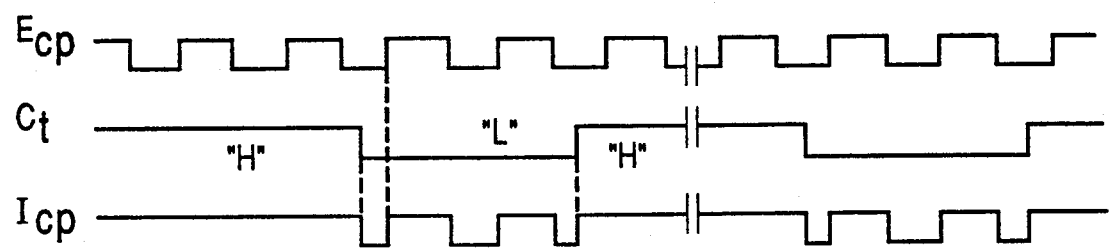
FIGS. 7A and 7B are timing diagrams illustrating how the conventional clock signal conversion circuit is operated.
Figure 7B:
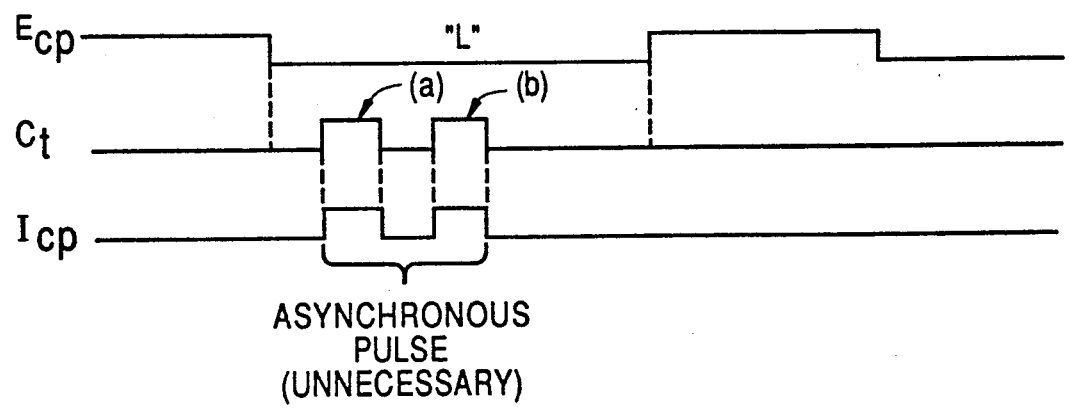

In the construction as described above, assume that the cycle of the control signal Ct is shorter than that of the external clock signal Icp, as shown in FIG. 4. As previously stated, in that case, there was the problem that changes in the control signal Ct in the "L" level period of the external clock signal Ecp appeared in the internal clock signal Icp. If, now, the flip-flop 12 is in the reset state, the output signal Sb therefrom will be the "H" level. Therefore, when both the control signal Ct and the external clock signal Ecp are "H", the forced set signal Sc outputted from the NAND gate 11 becomes "L" and causes the flip-flop 12 to shift to the set state. In the period of Ecp="L" in which the above described problem was caused by the conventional clock signal conversion circuit, the forced set signal Sc is maintained "H", and there is no change of state in the flip-flop 12. Therefore, even if in the period of Ecp="L" asynchronous pulses appeared in the control signal Ct, the flip-flop 12 would continue to maintain Sa="L" without being affected by the asynchronous pulses. As a result, the internal clock signal Icp is outputted with the same level as the external clock signal Ecp (in this case, "L" level), and the described above problem is overcome by the present invention.

Figure 3:
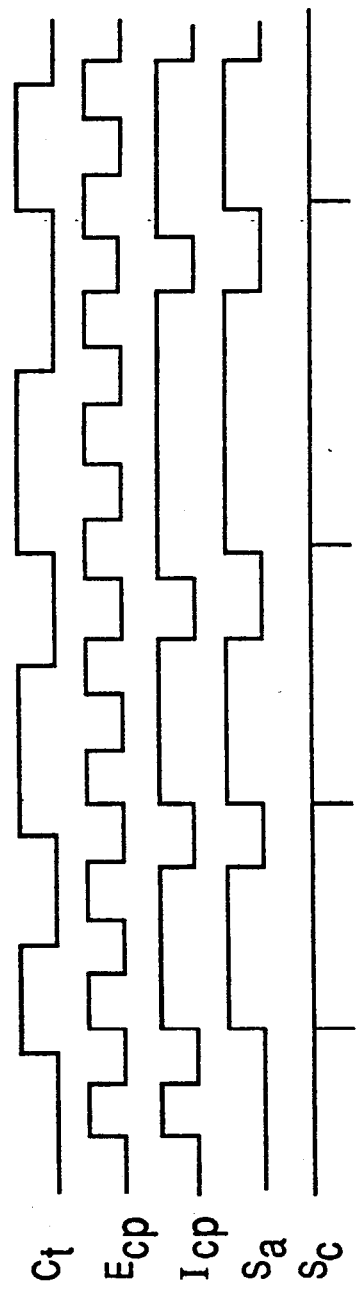
FIG. 3 is a timing diagram illustrating how the clock signal conversion circuit is operated when the cycle of the control signal Ct is longer than that of the external clock signal Ecp.

Now, assume that the cycle of the control signal Ct is longer than that of the external clock signal Ecp. The timing diagram in that case is shown in FIG. 3. As previously stated, the forced set signal Sc becomes "L" when the control signal Ct and the external clock signal Ecp are both "H" and when the flip-flop 12 is in the reset state (that is, Sb="H"). With Sc="L", the flip-flop 12 that has been in the reset state shifts to the set state and changes its output signal Sa from "L" to "H" and Sb from "H" to "L". Consequently, the internal clock signal Icp is fixed to "H" level during Sb="H". Thereafter, if the external clock signal Ecp falls from "H" to "L" during Ct="L", the flip-flop 12 then returns back to the reset state, so that the signal Sa is reversed from "H" to "L" and the signal Sb is reversed from "L" to "H". At this time, the internal clock signal Icp falls, synchronizing with the fall time of the external clock signal Ecp. That is to say, if the external clock signal Ecp rises while the control signal Ct is in "H" level, then the internal clock signal Icp also rises synchronizing with the rise time of the Ecp, and thereafter, if the external clock signal Ecp falls while the control signal Ct is in "L" level, then the internal clock signal Icp also falls synchronizing with the fall time of the Ecp. Consequently, by suitably setting the length of the "H" and "L" levels, an internal clock signal can be produced and outputted which synchronizes with the external clock signal and is controlled by the length of the "H" and "L" levels. It should be noted that, in the case where the cycle of the control signal is longer than that of the external clock signal Ecp, if the NAND gate 11 is not provided in the structure shown in FIG. 2, there is the possibility that unnecessary pulses appear in the internal clock signal Icp. These unnecessary pulses can also be eliminated by the FIG. 2 structure. Consequently, the present invention is particularly advantageous in the case that the cycle of the control signal is longer than that of the external clock signal Ecp.

While the invention has been described with relation to the preferred embodiment thereof, it will be apparent to those skilled in this art that various changes and modifications may be made therein without departing from the scope of the invention.

What I claim is:

1. A clock signal conversion circuit which receives a clock signal and a control signal and generates a converted clock signal, said clock signal conversion circuit comprising:

holding means for holding the control signal in response to the clock signal and outputting a held control signal;

masking means for selectively masking the clock signal in response to the held control signal and outputting the converted clock signal; and generating means for generating a set signal in response to the clock signal, the control signal and the held control signal, said holding means being forced to a predetermined state in response to the set signal.

2. A clock signal conversion circuit according to claim 1, wherein said holding means comprises a D-type flip-flop operatively connected to said masking means and said generating means to receive the clock and control signals.

3. A clock signal conversion circuit according to claim 2, wherein said D-type flip-flop comprises a flip-flop circuit having a data input terminal for receiving the control signal, a clock input terminal for receiving the clock signal, an output terminal connected to said masking means for outputting the held control signal, an inverted output terminal operatively connected to said generating means for outputting an inverted held control signal, and a set terminal connected to said generating means for receiving the set signal.

4. A clock signal conversion circuit according to claim 3, wherein said generating means comprises a NAND gate operatively connected to said flip-flop circuit for receiving the clock signal, the control signal and the inverted held control signal and outputting the set signal to the set terminal of said flip-flop circuit.

5. A clock signal conversion circuit according to claim 1, wherein said masking means comprises an OR-gate operatively connected to said holding means for receiving the clock signal and the held control signal and outputting the converted clock signal.

6. A clock signal conversion circuit according to claim 1, wherein the clock signal has a period smaller than the control signal.

7. A clock signal conversion circuit according to claim 1, wherein the control signal is asynchronous with respect to the control signal.

* * * * *

UNITED STATES PATENT AND TRADEMARK OFFICE
CERTIFICATE OF CORRECTION

PATENT NO. : 5,018,168

DATED : May 21, 1991

INVENTOR(S) : Takeru Matsuoka

It is certified that error appears in the above-identified patent and that said Letters Patent is hereby corrected as shown below:

Column 2, line 12, change "signal masking and" to --signal and--;

Column 2, line 13, change "signal; means" to --signal; masking means--;

Column 2, line 15, change "means or" to --means for--.

Signed and Sealed this

Twenty-second Day of September, 1992

Attest:

DOUGLAS B. COMER

*Attesting Officer*      *Acting Commissioner of Patents and Trademarks*